(12) United States Patent
Sekiya et al.

(10) Patent No.: US 12,538,762 B2
(45) Date of Patent: *Jan. 27, 2026

(54) PROCESSING METHOD OF BONDED WAFER

(71) Applicant: DISCO CORPORATION, Tokyo (JP)

(72) Inventors: Kazuma Sekiya, Tokyo (JP); Kazuya Hirata, Tokyo (JP); Hayato Iga, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 196 days.

This patent is subject to a terminal disclaimer.

(21) Appl. No.: 18/466,243

(22) Filed: Sep. 13, 2023

(65) Prior Publication Data

US 2024/0087901 A1 Mar. 14, 2024

(30) Foreign Application Priority Data

Sep. 14, 2022 (JP) ................................. 2022-145956

(51) Int. Cl.
*H01L 21/02* (2006.01)
*B23K 26/08* (2014.01)
(Continued)

(52) U.S. Cl.
CPC .... *H01L 21/02021* (2013.01); *B23K 26/0853* (2013.01); *B23K 26/40* (2013.01); *B23K 26/53* (2015.10); *H01L 21/02013* (2013.01); *H01L 21/02016* (2013.01); *H01L 21/185* (2013.01); *H01L 21/268* (2013.01); *H01L 21/304* (2013.01); *H01L 21/67092* (2013.01);
(Continued)

(58) Field of Classification Search
CPC ...................... H01L 21/67092; B23K 26/0676
See application file for complete search history.

(56) References Cited

U.S. PATENT DOCUMENTS

| | | | |
|---|---|---|---|
| 6,420,245 B1 * | 7/2002 | Manor | B28D 5/022 |
| | | | 438/460 |
| 7,682,225 B2 * | 3/2010 | Hongo | B24B 37/02 |
| | | | 451/446 |

(Continued)

FOREIGN PATENT DOCUMENTS

| | | | | |
|---|---|---|---|---|
| CN | 103862180 A | * | 6/2014 | ............ H10F 39/12 |
| JP | 2005032804 A | * | 2/2005 | |

(Continued)

*Primary Examiner* — Benjamin A Schiffman
(74) *Attorney, Agent, or Firm* — GREER BURNS & CRAIN, LTD.

(57) ABSTRACT

A processing method of a bonded wafer includes forming a plurality of modified layers in a form of rings through positioning focal points of laser beams with a wavelength having transmissibility with respect to a first wafer inside the first wafer, from which a chamfered part is to be removed, from a back surface of the first wafer and executing irradiation, holding a second wafer side on a chuck table, and grinding the back surface of the first wafer to thin the first wafer. In the forming the modified layers, the focal points of the laser beams are set in such a manner as to gradually get closer to a joining layer in a direction from an inner side of the first wafer toward an outer side thereof, so that the plurality of ring-shaped modified layers are formed in a form of descending stairs.

3 Claims, 4 Drawing Sheets

(51) Int. Cl.
*B23K 26/40* (2014.01)
*B23K 26/53* (2014.01)
*H01L 21/18* (2006.01)
*H01L 21/268* (2006.01)
*H01L 21/304* (2006.01)
*H01L 21/67* (2006.01)
*H01L 21/78* (2006.01)
*B23K 101/40* (2006.01)

(52) U.S. Cl.
CPC ........ *H01L 21/67115* (2013.01); *H01L 21/78* (2013.01); *B23K 2101/40* (2018.08)

(56) References Cited

U.S. PATENT DOCUMENTS

| | | | | |
|---|---|---|---|---|
| 8,125,654 | B2 * | 2/2012 | Benvegnu | H01L 22/12 |
| | | | | 356/630 |
| 8,821,644 | B2 * | 9/2014 | Sakuragi | H01L 21/02087 |
| | | | | 134/6 |
| 9,138,913 | B2 * | 9/2015 | Arai | B41M 5/26 |
| 9,255,894 | B2 * | 2/2016 | VanHoomissen | |
| | | | | G01N 21/9505 |
| 9,815,138 | B2 * | 11/2017 | Hirata | B23K 26/0604 |
| 9,929,018 | B2 * | 3/2018 | Bieck | H01L 21/6704 |
| 10,249,518 | B2 * | 4/2019 | Adachi | B24B 49/003 |
| 10,576,585 | B1 * | 3/2020 | Donofrio | B23K 26/0006 |
| 10,870,176 | B2 * | 12/2020 | Hirata | B23K 26/0823 |
| 11,222,822 | B2 * | 1/2022 | Yamamoto | H01L 21/78 |
| 11,819,950 | B2 * | 11/2023 | Komatsu | B23K 26/0823 |
| 11,881,407 | B2 * | 1/2024 | Nagaya | H01L 21/2683 |
| 11,958,132 | B2 * | 4/2024 | Hirata | B28D 5/0011 |
| 12,011,781 | B2 * | 6/2024 | Ungaro | B23K 26/38 |
| 12,151,401 | B2 * | 11/2024 | Komatsu | B28D 5/0064 |
| 12,191,138 | B2 * | 1/2025 | Tsuchiya | H01L 21/6836 |
| 12,251,776 | B2 * | 3/2025 | Flamm | C03B 33/0222 |
| 12,275,091 | B2 * | 4/2025 | Korematsu | B23K 26/08 |
| 12,288,682 | B2 * | 4/2025 | Kim | B23K 26/083 |
| 2004/0065647 | A1 * | 4/2004 | Kubo | H01L 21/67092 |
| | | | | 257/E23.179 |
| 2004/0169869 | A1 * | 9/2004 | Shin | G01N 21/9501 |
| | | | | 356/635 |
| 2005/0199592 | A1 * | 9/2005 | Iri | B23K 26/40 |
| | | | | 219/121.6 |
| 2008/0128396 | A1 * | 6/2008 | Shigematsu | B23K 26/702 |
| | | | | 219/121.67 |
| 2008/0200100 | A1 * | 8/2008 | Takahashi | H01L 21/67219 |
| | | | | 438/692 |
| 2023/0036386 | A1 * | 2/2023 | Taylor | B23K 26/0652 |
| 2023/0048318 | A1 * | 2/2023 | Hirata | B23K 26/38 |
| 2023/0050807 | A1 * | 2/2023 | Iga | H01L 21/268 |
| 2023/0054570 | A1 * | 2/2023 | Sakamoto | B23K 26/0648 |
| 2023/0066601 | A1 * | 3/2023 | Iga | B23K 26/53 |
| 2024/0112902 | A1 * | 4/2024 | Iga | H01L 21/78 |
| 2024/0120215 | A1 * | 4/2024 | Iga | B24B 7/228 |
| 2024/0128087 | A1 * | 4/2024 | Iga | H01L 21/6835 |
| 2024/0145248 | A1 * | 5/2024 | Iga | H01L 22/12 |
| 2024/0153776 | A1 * | 5/2024 | Iga | H01L 21/02021 |
| 2024/0194501 | A1 * | 6/2024 | Iizuka | H01L 21/68728 |
| 2024/0297052 | A1 * | 9/2024 | Tanaka | H01L 21/78 |
| 2024/0304448 | A1 * | 9/2024 | Tanaka | H01L 21/304 |
| 2024/0304457 | A1 * | 9/2024 | Tanaka | H01L 21/304 |
| 2024/0339326 | A1 * | 10/2024 | Chen | H01L 21/67051 |
| 2024/0399494 | A1 * | 12/2024 | Hirata | B23K 26/38 |
| 2025/0014949 | A1 * | 1/2025 | Mizutani | H01L 22/12 |

FOREIGN PATENT DOCUMENTS

| | | | | |
|---|---|---|---|---|
| JP | 2008500907 A | * | 1/2008 | ....... H01L 21/67023 |
| JP | 2008298696 A | * | 12/2008 | ......... G01N 21/8806 |
| JP | 2010225976 A | | 10/2010 | |
| JP | 2013237115 A | * | 11/2013 | |
| JP | 2016096295 A | | 5/2016 | |
| JP | 2020136662 A | * | 8/2020 | ....... H01L 21/67242 |
| JP | 2022043891 A | * | 3/2022 | |
| JP | 2024011097 A | * | 1/2024 | |

* cited by examiner

FIG.2
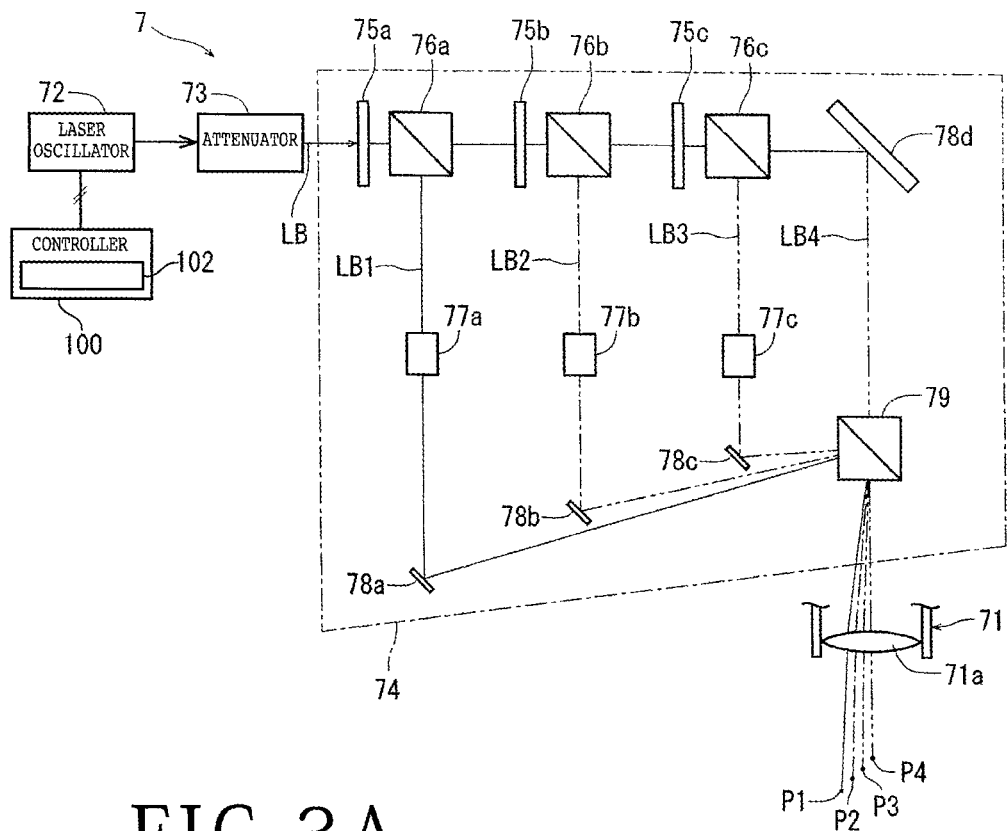
FIG.3A
FIG.3B
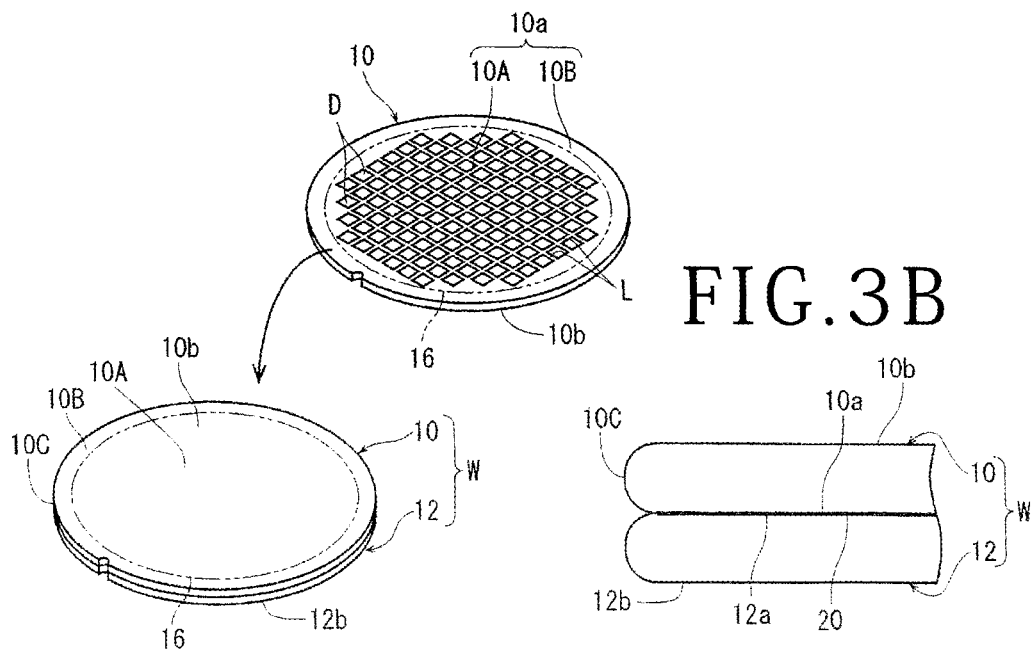

PROCESSING METHOD OF BONDED WAFER

BACKGROUND OF THE INVENTION

Field of the Invention

The present invention relates to a processing method of a bonded wafer and a processing apparatus.

Description of the Related Art

A wafer having a front surface on which a plurality of devices such as integrated circuits (ICs) and large-scale integration (LSI) circuits are formed in such a manner as to be marked out by a plurality of planned dividing lines that intersect is divided into individual device chips by a dicing apparatus, and the device chips thus obtained are used for pieces of electrical equipment such as mobile phones and personal computers.

Further, in order to improve the degree of integration of devices, in some cases, wafers after formation of a pattern are bonded to each other, and thereafter one of the wafers is ground to be thinned.

However, when a back surface of the one wafer is ground to execute thinning, there is a problem that a chamfered part formed at an outer circumference of the wafer becomes a sharp shape like a knife-edge and that an injury of a worker is induced or cracks develop from the knife-edge to the inside of the wafer and the devices are damaged.

Hence, a technique has been proposed in which a cutting blade or grinding abrasive stones are directly positioned to the outer circumference of a wafer for which the back surface is to be ground, and the chamfered part is removed to suppress occurrence of a knife-edge (for example, refer to Japanese Patent Laid-open No. 2010-225976 and Japanese Patent Laid-open No. 2016-96295).

SUMMARY OF THE INVENTION

In the technique disclosed in Japanese Patent Laid-open No. 2010-225976 and Japanese Patent Laid-open No. 2016-96295, there is a problem that it takes a considerable length of time to remove the chamfered part by the cutting blade or the grinding abrasive stones and the productivity is low. In addition, there is a problem that the other wafer in the bonded wafer is scratched.

Thus, an object of the present invention is to provide a processing method of a bonded wafer and a processing apparatus that can eliminate a problem that it takes long to remove a chamfered part and the productivity is low and a problem that the other wafer in the bonded wafer is scratched.

In accordance with an aspect of the present invention, there is provided a processing method of a bonded wafer formed through bonding, by a joining layer, a front surface of a first wafer and a front surface or a back surface of a second wafer, the first wafer having, on the front surface thereof, a device region in which a plurality of devices are formed and an outer circumferential surplus region that surrounds the device region and that includes a chamfered part formed at an outer circumferential edge. The processing method includes a focal point setting step of causing a laser beam with a wavelength having transmissibility with respect to the first wafer to branch into a plurality of branch laser beams and setting focal points of the respective branch laser beams at different positions, a modified layer forming step of forming a plurality of modified layers in a form of rings through holding a side of the second wafer by a first chuck table, positioning the focal points of the branch laser beams inside the first wafer on an inner side in a radial direction relative to the chamfered part from a back surface of the first wafer, and executing irradiation with the branch laser beams, and a grinding step of holding the side of the second wafer by a second chuck table and grinding the back surface of the first wafer to thin the first wafer after the modified layer forming step is executed. In the modified layer forming step, the focal points of the branch laser beams are formed in a form of descending stairs in such a manner as to gradually get closer to the joining layer in a direction from an inner side toward an outer side of the first wafer, and a surface that links the plurality of modified layers formed by the plurality of focal points forms a side surface of a truncated cone.

Preferably, cracks develop from the plurality of modified layers toward the joining layer, and in the grinding step, the modified layers are removed due to the grinding of the back surface, and the chamfered part is removed from the first wafer due to the cracks. Preferably, the cracks develop toward an outer side of the joining layer in the radial direction.

In accordance with another aspect of the present invention, there is provided a processing apparatus that processes a wafer, the processing apparatus including a chuck table that has a rotational drive mechanism and that holds a wafer, a laser beam irradiation unit that executes irradiation with a laser beam with a wavelength having transmissibility with respect to the wafer held by the chuck table, an X-axis feed mechanism that executes processing feed of the chuck table and the laser beam irradiation unit relative to each other in an X-axis direction, a Y-axis feed mechanism that executes processing feed of the chuck table and the laser beam irradiation unit relative to each other in a Y-axis direction, and a controller. The laser beam irradiation unit includes a focal point forming unit capable of forming a plurality of focal points of the laser beam in a form of descending stairs. The controller includes a coordinate storing section that stores an X-coordinate and a Y-coordinate in the wafer to be processed, and controls the X-axis feed mechanism, the Y-axis feed mechanism, and the rotational drive mechanism of the chuck table on the basis of the coordinates stored in the coordinate storing section.

According to the processing method of a bonded wafer of the present invention, compared with the case of directly removing the chamfered part by use of a cutting blade or grinding abrasive stones, the processing period of time is shortened, and the productivity improves. In addition, the problem that the other wafer is scratched is also eliminated.

According to the processing apparatus of the present invention, compared with the case of directly removing the chamfered part by use of a cutting blade or grinding abrasive stones, the processing period of time is shortened, and the productivity improves. In addition, the problem that the other wafer is scratched can be solved.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a block diagram illustrating an optical system of a laser beam irradiation unit mounted in the processing apparatus illustrated in FIG. 1;

FIG. 3A is a perspective view of a wafer that is a workpiece;

FIG. 3B is a side view in which part of the wafer illustrated in FIG. 3A is enlarged;

DETAILED DESCRIPTION OF THE PREFERRED EMBODIMENT

A processing method of a bonded wafer according to an embodiment of the present invention and a processing apparatus suitable to execute the processing method of a bonded wafer will be described in detail below with reference to the accompanying drawings.

Figure 1:
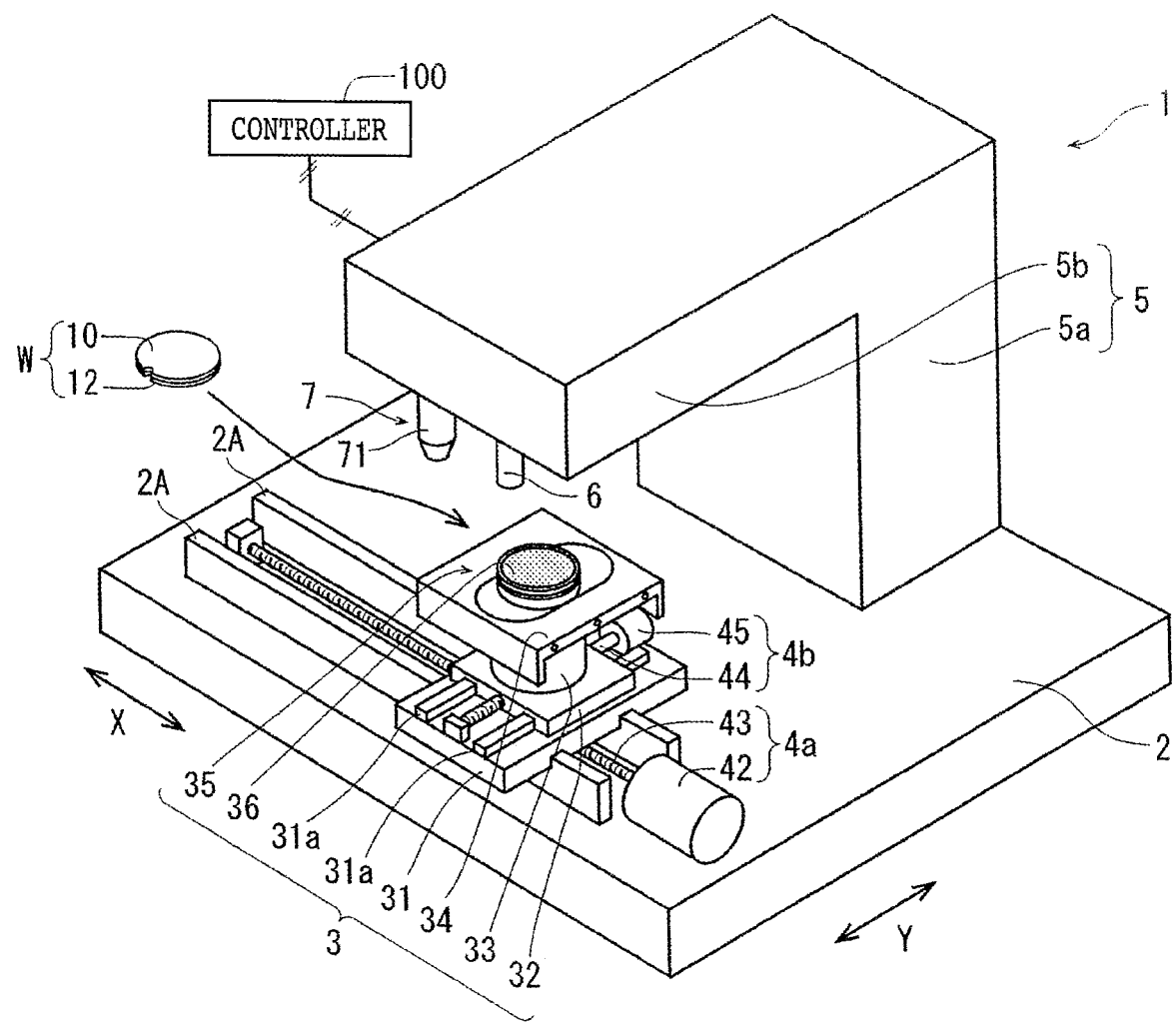
FIG. 1 is an overall perspective view of a processing apparatus.

In FIG. 1, an overall perspective view of a processing apparatus 1 of the present embodiment is illustrated. The processing apparatus 1 is an apparatus that executes laser processing for a bonded wafer W obtained by stacking a first wafer 10 and a second wafer 12 like illustrated ones. The processing apparatus 1 includes a holding unit 3 including a chuck table 35 that has an unillustrated rotational drive mechanism and that holds the bonded wafer W, and a laser beam irradiation unit 7 that executes irradiation with a laser beam with a wavelength having transmissibility with respect to the first wafer 10 held by the chuck table 35. The processing apparatus 1 includes also an X-axis feed mechanism 4a that executes processing feed of the chuck table 35 and the laser beam irradiation unit 7 relative to each other in an X-axis direction, a Y-axis feed mechanism 4b that executes processing feed of the chuck table 35 and the laser beam irradiation unit 7 relative to each other in a Y-axis direction orthogonal to the X-axis direction, and a controller 100 that controls the respective operating parts.

The processing apparatus 1 is disposed on a base 2 and includes, in addition to the above-described configuration, an imaging unit 6 that images the bonded wafer W held by the chuck table 35 and that executes alignment, and a frame body 5 including a vertical wall part 5a erected on a lateral side of the X-axis feed mechanism 4a and the Y-axis feed mechanism 4b over the base 2 and a horizontal wall part 5b that extends in a horizontal direction from an upper end part of the vertical wall part 5a.

The holding unit 3 is means that includes the chuck table 35 having an XY-plane defined based on the X-coordinate and the Y-coordinate as a holding surface and that holds the bonded wafer W. As illustrated in FIG. 1, the holding unit 3 includes a rectangular X-axis direction movable plate 31 mounted over the base 2 movably in the X-axis direction, a rectangular Y-axis direction movable plate 32 mounted over the X-axis direction movable plate 31 movably in the Y-axis direction, a circular cylindrical support column 33 fixed to an upper surface of the Y-axis direction movable plate 32, and a rectangular cover plate 34 fixed to an upper end of the support column 33. The chuck table 35 is disposed to pass through a long hole formed in the cover plate 34 and extend upward, and is configured to be rotatable by the unillustrated rotational drive mechanism that is housed in the support column 33. The holding surface of the chuck table 35 includes a suction adhesion chuck 36 of a porous material having air permeability and is connected to unillustrated suction means by a flow path that passes through the support column 33.

The X-axis feed mechanism 4a converts rotational motion of a motor 42 to linear motion through a ball screw 43 and transmits the linear motion to the X-axis direction movable plate 31 to move the X-axis direction movable plate 31 in the X-axis direction along a pair of guide rails 2A disposed along the X-axis direction on the base 2. The Y-axis feed mechanism 4b converts rotational motion of a motor 45 to linear motion through a ball screw 44 and transmits the linear motion to the Y-axis direction movable plate 32 to move the Y-axis direction movable plate 32 in the Y-axis direction along a pair of guide rails 31a disposed along the Y-axis direction on the X-axis direction movable plate 31. Due to inclusion of such a configuration, the chuck table 35 can be moved to any position of the X-coordinate and the Y-coordinate.

The imaging unit 6 and an optical system that configures the above-described laser beam irradiation unit 7 are housed inside the horizontal wall part 5b of the frame body 5. On a lower surface side of a tip part of the horizontal wall part 5b, a light collector 71 that configures part of the laser beam irradiation unit 7 and that focuses a laser beam to irradiate the bonded wafer W with the laser beam is disposed. The imaging unit 6 is a camera that images the bonded wafer W held by the holding unit 3 and that detects the position and orientation of the bonded wafer W, laser processing positions that should be irradiated with the laser beam, and so forth, and is disposed at a position adjacent to the above-described light collector 71 in the X-axis direction indicated by an arrow X in the diagram.

In FIG. 2, a block diagram illustrating an outline of the optical system of the above-described laser beam irradiation unit 7 is illustrated. The laser beam irradiation unit 7 includes a laser oscillator 72 that emits a laser beam LB, an attenuator 73 that adjusts output power of the laser beam LB emitted by the laser oscillator 72, and a focal point forming unit 74 that causes the laser beam LB having passed through the attenuator 73 to branch and that forms a plurality of focal points in a form of descending stairs inside the bonded wafer W held by the chuck table 35.

For example, as illustrated in FIG. 2, the focal point forming unit 74 of the present embodiment includes a first half wave plate 75a, a first beam splitter 76a, a second half wave plate 75b, a second beam splitter 76b, a third half wave plate 75c, a third beam splitter 76c, a first beam expander 77a, a second beam expander 77b, a third beam expander 77c, a first reflective mirror 78a, a second reflective mirror 78b, a third reflective mirror 78c, a fourth reflective mirror 78d, and a fourth beam splitter 79.

The laser beam LB that has passed through the above-described attenuator 73 is introduced to the first beam splitter 76a through the first half wave plate 75a, and the rotation angle of the first half wave plate 75a is adjusted as appropriate. Due to this, a first branch laser beam LB1 (s-polarized light) with the ¼ light amount with respect to the above-described laser beam LB is made to branch from the first beam splitter 76a and is introduced to the first beam expander 77a. Further, the remaining laser beam (p-polarized light) that is not made to branch by the first beam splitter 76a is introduced to the second beam splitter 76b through the second half wave plate 75b, and the rotation angle of the second half wave plate 75b is adjusted as appropriate. Due to this, a second branch laser beam LB2 (s-polarized light) with the ¼ light amount with respect to the above-described laser beam LB is made to branch from the second beam splitter 76b and is introduced to the second beam expander 77b.

Moreover, the remaining laser beam (p-polarized light) that is not made to branch by the second beam splitter 76b is introduced to the third beam splitter 76c through the third half wave plate 75c, and the rotation angle of the third half wave plate 75c is adjusted as appropriate. Due to this, a third branch laser beam LB3 (s-polarized light) with the ¼ light amount with respect to the above-described laser beam LB is made to branch from the third beam splitter 76c and is introduced to the third beam expander 77c. The remaining laser beam (p-polarized light) that is not made to branch by the third beam splitter 76c becomes a fourth branch laser beam LB4 (p-polarized light) with the ¼ light amount with respect to the above-described laser beam LB and is introduced to the fourth reflective mirror 78d. As described above, the first to fourth branch laser beams LB1 to LB4 are each made to branch with the ¼ light amount with respect to the above-described laser beam LB.

The first branch laser beam LB1 is the s-polarized light. Hence, after the beam diameter thereof is adjusted by the first beam expander 77a, the first branch laser beam LB1 is reflected by the first reflective mirror 78a, introduced to the fourth beam splitter 79 to be reflected, and then introduced to a collecting lens 72a of the light collector 71. Further, the second branch laser beam LB2 is also the s-polarized light. After the beam diameter thereof is adjusted by the second beam expander 77b, the second branch laser beam LB2 is reflected by the second reflective mirror 78b, introduced to the fourth beam splitter 79 to be reflected, and then introduced to the collecting lens 72a of the light collector 71. Moreover, the third branch laser beam LB3 is also the s-polarized light. After the beam diameter thereof is adjusted by the third beam expander 77c, the third branch laser beam LB3 is reflected by the third reflective mirror 78c, introduced to the fourth beam splitter 79 to be reflected, and then introduced to the collecting lens 72a of the light collector 71. In addition, the fourth branch laser beam LB4 reflected by the fourth reflective mirror 78d is the p-polarized light, and travels straight through the fourth beam splitter 79 and is introduced to the collecting lens 72a of the light collector 71. The magnitude of the respective beam diameters is adjusted as appropriate by the first to third beam expanders 77a to 77c to satisfy a relation of LB1>LB2>LB3>LB4. In addition, the angle of the first to fourth reflective mirrors 78a to 78d is adjusted. Due to this, as illustrated in FIG. 2, focal points P1 to P4 corresponding to the first to fourth branch laser beams LB1 to LB4 are formed at different positions in an upward-downward direction and the horizontal direction and are formed in a form of descending stairs toward the left side in the diagram from the focal point P4 toward the focal point P1.

For convenience of explanation, the example in which the above-described focal point forming unit 74 causes the laser beam LB having passed through the attenuator 73 to branch into the first to fourth branch laser beams LB1 to LB4 and forms four focal points (the number of branches is 4) has been described. However, the present invention is not limited thereto. It is possible to make the setting to form more branch laser beams by increasing the half wave plate, the beam splitter, the beam expander, the reflective mirror, and so forth, and the focal point forming unit 74 may form focal points according to the number of branches in a form of descending stairs.

The controller 100 is configured by a computer and includes a central processing unit (CPU) that executes calculation processing in accordance with a control program, a read-only memory (ROM) that stores the control program and so forth, a readable-writable random access memory (RAM) for temporarily storing a detection value detected, a calculation result, and so forth, an input interface, and an output interface (illustration about details is omitted). A coordinate storing section 102 that stores the X-coordinate and the Y-coordinate of processing positions in the bonded wafer W is disposed in the controller 100. The X-axis feed mechanism 4a, the Y-axis feed mechanism 4b, and the unillustrated rotational drive mechanism of the chuck table 35 are connected to the controller 100 and are controlled based on the information on the X-coordinate and the Y-coordinate stored in the coordinate storing section 102.

The processing apparatus 1 of the present embodiment has the configuration described above substantially, and the processing method of a wafer according to the present embodiment will be described below.

A workpiece of the processing method of a wafer executed in the present embodiment is the bonded wafer W illustrated in FIG. 3A and FIG. 3B, for example. The bonded wafer W is a wafer with a diameter of 300 mm, for example, and is a bonded wafer obtained by bonding the first wafer 10 and the second wafer 12. The first wafer 10 is, for example, a silicon on insulator (SOI) wafer in which an oxide film layer is formed inside a silicon substrate, and a plurality of devices D are formed on a front surface 10a in such a manner as to be marked out by a plurality of planned dividing lines L that intersect, as illustrated in the diagram. The front surface 10a of the first wafer 10 includes a device region 10A that is closer to the center and in which the above-described devices D are formed, and an outer circumferential surplus region 10B that surrounds the device region 10A. Moreover, at an outer circumferential end part of the outer circumferential surplus region 10B, an annular chamfered part 10C formed into a curved surface shape is formed as is understood from FIG. 3B. In FIG. 3A, a segmentation line 16 that makes segmentation into the device region 10A and the outer circumferential surplus region 10B is illustrated. However, the segmentation line 16 is illustrated for convenience of explanation and is not given to the front surface 10a of the actual first wafer 10. The second wafer 12 of the present embodiment has substantially the same configuration as the first wafer 10, and detailed description thereof is omitted. As is understood from FIG. 3B in addition to FIG. 3A, the bonded wafer W is formed through inverting the first wafer 10 to orient the front surface 10a downward and joining the front surface 10a of the first wafer 10 and a front surface 12a of the second wafer 12 with the interposition of a joining layer 20 based on an appropriate adhesive. The bonded wafer W processed by the processing method of a wafer according to the present invention is not limited to the above-described bonded wafer or layer-stacked wafer obtained by joining the front surface 10a of the first wafer 10 and the front surface 12a of the second wafer 12 and may be a bonded wafer obtained by joining the front surface 10a of the first wafer 10 and a back surface 12b of the second wafer 12.

Figure 4:
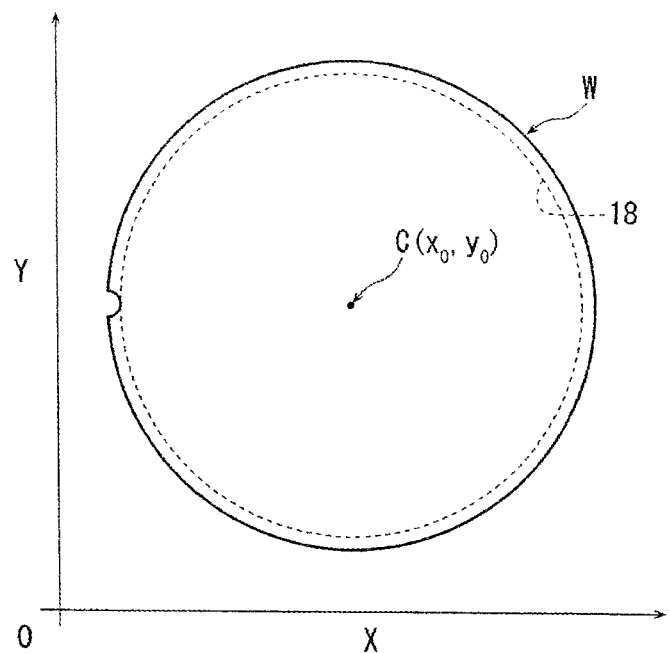
FIG. 4 is a plan view of the wafer imaged by an imaging unit.

When the processing method of a wafer according to the present embodiment is executed, the above-described bonded wafer W is conveyed to the processing apparatus 1 described based on FIG. 1 and is placed on the chuck table 35 in such a manner that a back surface 10b of the first wafer 10 that configures the bonded wafer W is oriented upward and the side of the back surface 12b of the second wafer 12 is oriented downward. Then, the above-described suction means is actuated to hold the bonded wafer W under suction. Subsequently, the X-axis feed mechanism 4a and the Y-axis feed mechanism 4b are actuated to position the bonded wafer W directly under the imaging unit 6, and imaging is executed from the side of the upper surface of the bonded wafer W (back surface 10b of the first wafer 10). Then, as illustrated in FIG. 4, the X-coordinate and the Y-coordinate (x0, y0) of a center C are identified from the coordinates of an outer edge of the bonded wafer W, for example. Then, because the X-coordinate and the Y-coordinate of processing positions 18 in the bonded wafer W that should be processed by a laser beam are stored in the coordinate storing section 102 of the controller 100 as described above, the X-coordinate and the Y-coordinate on the chuck table 35 regarding the processing positions 18 at which the focal points P1 to P4 of the above-described branch laser beams LB1 to LB4 are to be positioned and a modified layer is to be formed are identified due to the identification of the X-coordinate and the Y-coordinate of the center C of the bonded wafer W. The processing positions 18 are set to exist in the above-described outer circumferential surplus region 10B (on an outer side relative to the above-described segmentation line 16 although illustration is omitted) and on an inner side as viewed in a diameter direction relative to the chamfered part 10C having a curved surface. For example, the processing positions 18 are set at positions of a radius of 149.5 mm from the center C. In the illustration, the processing positions 18 to which the focal point P4 is positioned are illustrated by one annular dashed line for convenience of explanation. However, because the laser beam irradiation unit 7 of the processing apparatus of the present embodiment forms the plurality of focal points P1 to P4 in a form of descending stairs as described above, the X-coordinate and the Y-coordinate of the processing positions 18 may be identified to correspond to the respective focal points P1 to P4.

Figure 5A:
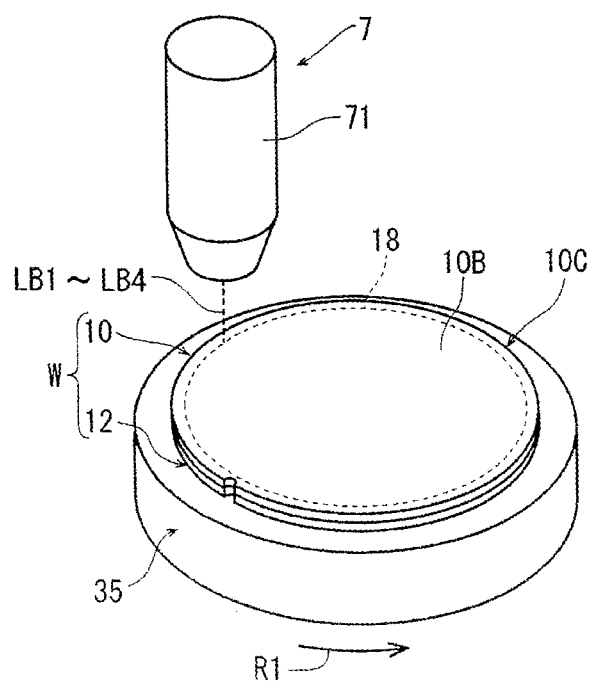
FIG. 5A is a perspective view illustrating an execution form of a modified layer forming step.
Figure 5B:
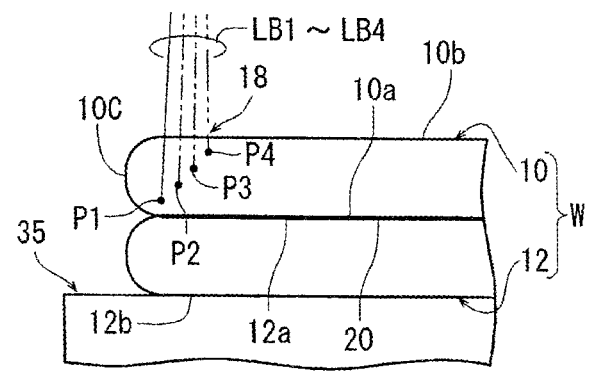
FIG. 5B is a conceptual diagram illustrating positions at which focal points are formed in the modified layer forming step.
Figure 5C:
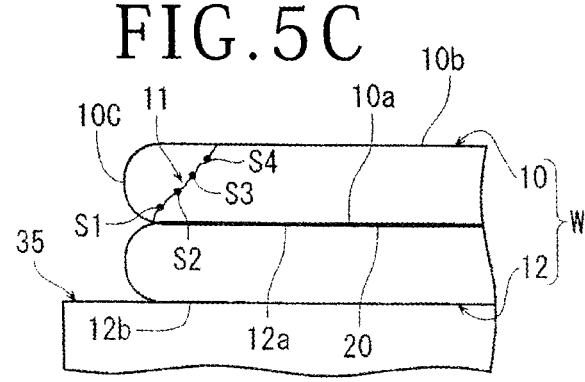
FIG. 5C is a conceptual diagram illustrating modified layers and cracks formed in the modified layer forming step.

After the processing positions 18 are identified as described above, the X-axis feed mechanism 4a and the Y-axis feed mechanism 4b are actuated by the controller 100, and the processing position 18 in the bonded wafer W is positioned directly under the light collector 71 of the laser beam irradiation unit 7 as illustrated in FIG. 5A. Subsequently, the above-described laser beam irradiation unit 7 is actuated to execute irradiation with the first to fourth branch laser beams LB1 to LB4, and the plurality of focal points P1 to P4 formed in a form of descending stairs are positioned in such a manner as to gradually get closer to the joining layer 20 in the direction from the inner side of the first wafer 10 toward the outer side thereof as illustrated in FIG. 5B. The chuck table 35 is rotated in a direction indicated by an arrow R1 (see FIG. 5A). In the present embodiment, the same place is irradiated with the laser beam twice by causing the chuck table 35 to make two revolutions. By executing the modified layer forming step as above, as illustrated in FIG. 5C, modified layers S1 to S4 are formed to make a truncated cone shape inside the first wafer 10 that configures the bonded wafer W, along the processing positions 18 in the outer circumferential surplus region 10B of the first wafer 10, and cracks 11 that couple the respective modified layers S1 to S4 are formed. By the present embodiment, it becomes possible to execute irradiation with the first to fourth branch laser beams LB1 to LB4 from the inner side with avoidance of the chamfered part 10C. Therefore, diffuse reflection at the chamfered part 10C having a curved surface is avoided, and the modified layers can be formed with high accuracy. The interval of the respective focal points P1 to P4 formed by the above-described first to fourth branch laser beams LB1 to LB4 is set to 10 μm as viewed in the horizontal direction and in a range of 1 to 10 μm as viewed in the upward-downward direction, for example.

Laser processing conditions adopted when the laser processing in the above-described modified layer forming step is executed are set as follows, for example.
  Wavelength: 1342 nm
  Repetition frequency: 60 kHz
  Output power: 2.4 W
  Number of branches: 4
  Chuck table rotation speed: 107.3 deg/s (circumferential speed 280 mm/s)

Figure 6A:
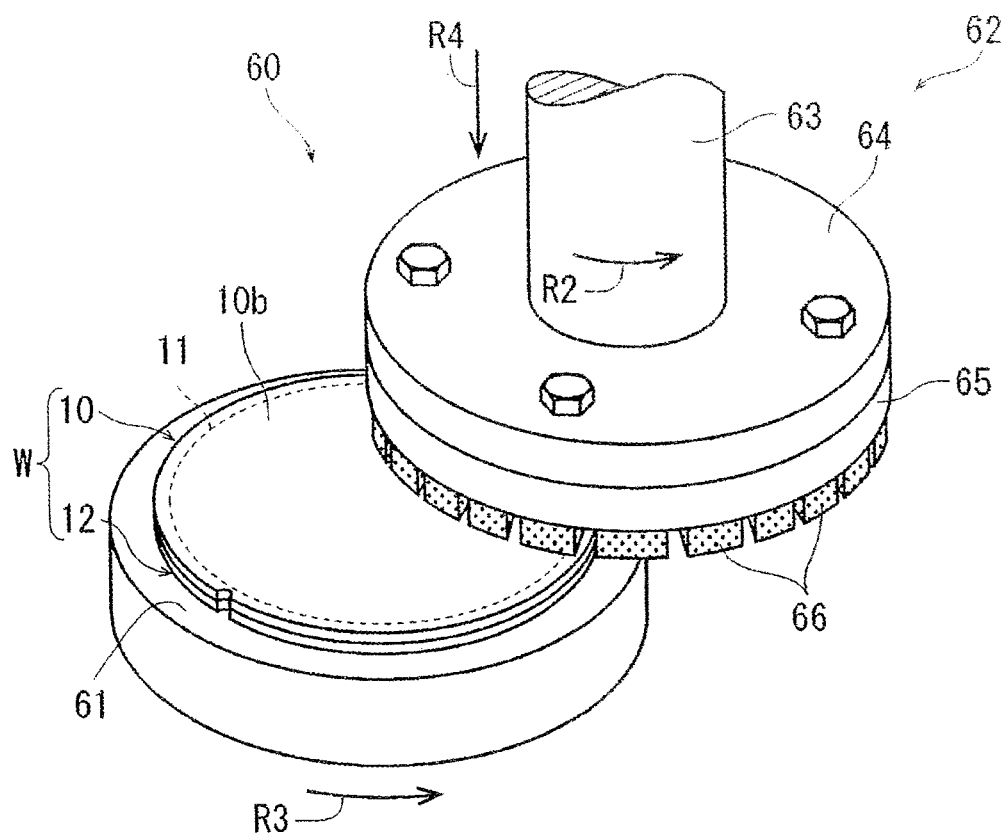
FIG. 6A is a perspective view illustrating an execution form of a grinding step.

After the modified layer forming step is executed as described above, the bonded wafer W is conveyed to a grinding apparatus 60 illustrated in FIG. 6A (only part thereof is illustrated). As illustrated in FIG. 6A, the grinding apparatus 60 includes a grinding unit 62 for grinding and thinning the bonded wafer W held under suction on a chuck table 61. The grinding unit 62 includes a rotating spindle 63 rotated by an unillustrated rotational drive mechanism, a wheel mount 64 mounted on a lower end of the rotating spindle 63, and a grinding wheel 65 attached to a lower surface of the wheel mount 64, and a plurality of grinding abrasive stones 66 are annularly disposed on a lower surface of the grinding wheel 65.

Figure 6B:
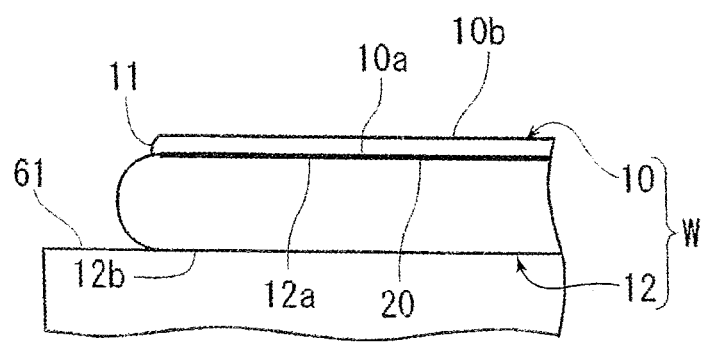
FIG. 6B is a side view illustrating part of the wafer thinned by the grinding step, in an enlarged manner.

After the bonded wafer W for which the above-described modified layer forming step has been executed is conveyed to the grinding apparatus 60 and the side of the second wafer 12 is placed on the chuck table 61 and is held under suction, while the rotating spindle 63 of the grinding unit 62 is rotated at, for example, 6000 rpm in a direction indicated by an arrow R2 in FIG. 6A, the chuck table 61 is rotated at, for example, 300 rpm in a direction indicated by an arrow R3. Then, while grinding water is supplied onto the back surface 10b of the first wafer 10 of the bonded wafer W by an unillustrated grinding water supply unit, the grinding abrasive stones 66 are brought into contact with the back surface 10b of the first wafer 10, and grinding feed of the grinding wheel 65 is executed in a direction indicated by an arrow R4 at a grinding feed rate of 1 μm/second, for example. At this time, the grinding can be advanced while the thickness of the first wafer 10 is measured by an unillustrated measuring gauge of a contact type. As illustrated in FIG. 6B, by grinding the back surface 10b of the first wafer 10 by a predetermined amount, the above-described modified layers S1 to S4 are removed, and the chamfered part 10C of the first wafer 10 is scattered and removed due to the cracks 11. After the chamfered part 10C is removed, the grinding unit 62 is stopped, and the grinding step of grinding the bonded wafer W is completed through cleaning, drying, and other steps regarding which explanation is omitted, so that the processing method of a wafer according to the present embodiment is completed.

As described above, by executing the modified layer forming step with use of the processing apparatus 1 of the present embodiment, the plurality of focal points P1 to P4 are set in a form of descending stairs, and the modified layers S1 to S4 are formed on a side surface of a truncated cone inside the first wafer 10 that configures the bonded wafer W. Further, the cracks 11 develop in such a manner as to connect the modified layers S1 to S4, so that the cracks 11 develop to an outer side of the above-described joining layer 20 while extending toward the joining layer 20. By executing the above-described grinding step for such a bonded wafer W, the chamfered part 10C is removed due to the cracks 11. Therefore, compared with removal of the chamfered part by use of a cutting blade or grinding abrasive stones, the processing period of time is shortened, and the productivity improves. In addition, the problem that the other wafer, that is, the second wafer, is scratched is also eliminated.

In the above-described embodiment, the focal point forming unit 74 that configures the laser beam irradiation unit 7 is implemented by combining the plurality of half wave plates, the plurality of beam splitters, the plurality of beam expanders, the plurality of reflective mirrors, and so forth. However, the present invention is not limited thereto. For example, the following configuration may be employed. A spatial light modulator (liquid crystal on silicon (LCOS)) is disposed instead of the focal point forming unit 74 illustrated in FIG. 2, the laser beam LB emitted from the laser oscillator 72 is made to be incident on the spatial light modulator, and the laser beam LB is made to branch into a plurality of branch laser beams. Further, a plurality of focal points of the respective branch laser beams are formed in a form of descending stairs in such a manner as to gradually get closer to the joining layer in the direction from the inner side of a wafer toward the outer side thereof, and modified layers are formed to make a truncated cone shape corresponding to the plurality of focal points.

Moreover, in the above-described embodiment, the bonded wafer W is conveyed to the grinding apparatus 60 in the state in which the chamfered part 10C of the first wafer 10 is left, the grinding step is executed, and the chamfered part 10C is then removed by a crushing force at the time of grinding with the cracks 11 formed among the modified layers S1 to S4 being the point of origin. However, the present invention is not limited thereto, and the chamfered part 10C may be removed by giving an external force before the bonded wafer W is carried in to the grinding apparatus 60.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a bonded wafer formed through bonding, by a joining layer, a front surface of a first wafer and a front surface or a back surface of a second wafer, the first wafer having, on the front surface thereof, a device region in which a plurality of devices are formed and an outer circumferential surplus region that surrounds the device region and that includes a chamfered part formed at an outer circumferential edge, the processing method comprising:
    a focal point setting step of causing a laser beam with a wavelength having transmissibility with respect to the first wafer to branch into a plurality of branch laser beams and setting focal points of the respective branch laser beams at different positions;
    a modified layer forming step of forming a plurality of modified layers in a form of rings through holding a side of the second wafer by a first chuck table, positioning the focal points of the branch laser beams inside the first wafer on an inner side in a radial direction relative to the chamfered part from a back surface of the first wafer, and executing irradiation with the branch laser beams; and
    a grinding step of holding the side of the second wafer by a second chuck table and grinding the back surface of the first wafer to thin the first wafer after the modified layer forming step is executed, wherein,
    in the modified layer forming step, the focal points of the branch laser beams are formed in a form of descending stairs in such a manner as to gradually get closer to the joining layer in a direction from an inner side toward an outer side of the first wafer, and a surface that links the plurality of modified layers formed by the plurality of focal points forms a side surface of a truncated cone.

2. The processing method according to claim 1, wherein cracks develop from the plurality of modified layers toward the joining layer, and in the grinding step, the modified layers are removed due to the grinding of the back surface, and the chamfered part is removed from the first wafer due to the cracks.

3. The processing method according to claim 2, wherein the cracks develop toward an outer side of the joining layer in the radial direction.

* * * * *